(12) United States Patent
Goto

(10) Patent No.: US 8,070,535 B2
(45) Date of Patent: Dec. 6, 2011

(54) PRINTED CIRCUIT BOARD TERMINAL AND PRINTED CIRCUIT BOARD CONNECTOR HAVING THE SAME

(75) Inventor: Hideki Goto, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 12/913,882

(22) Filed: Oct. 28, 2010

(65) Prior Publication Data
US 2011/0111609 A1    May 12, 2011

(30) Foreign Application Priority Data
Nov. 11, 2009    (JP) .................................. 2009-258249

(51) Int. Cl.
*H01R 4/02*    (2006.01)
(52) U.S. Cl. ........................................................ 439/876
(58) Field of Classification Search .................. 439/876, 439/884, 79, 83, 82, 751
See application file for complete search history.

(56) References Cited

U.S. PATENT DOCUMENTS

| | | | | |
|---|---|---|---|---|
| 4,687,267 A * | 8/1987 | Header et al. | ..................... | 439/62 |
| 5,076,796 A * | 12/1991 | Kusayanagi et al. | ............ | 439/83 |
| 5,112,233 A * | 5/1992 | Lybrand | ........................... | 439/79 |
| 5,161,999 A * | 11/1992 | Broschard et al. | ............. | 439/567 |
| 5,507,654 A * | 4/1996 | Daly et al. | ..................... | 439/76.1 |
| 5,607,313 A * | 3/1997 | Nyman | ............................... | 439/83 |
| 6,062,916 A * | 5/2000 | Gladd et al. | .................... | 439/751 |
| 6,540,559 B1 * | 4/2003 | Kemmick et al. | ......... | 439/607.05 |
| 7,134,886 B2 | 11/2006 | Okamura et al. | | |
| 7,214,074 B2 * | 5/2007 | Osada | .............................. | 439/79 |
| 2002/0002007 A1 | 1/2002 | Endo et al. | | |

FOREIGN PATENT DOCUMENTS

| | | |
|---|---|---|
| JP | 2000-30834 | 1/2000 |
| JP | 2004-303680 | 10/2004 |
| JP | 2005-197092 | 7/2005 |
| JP | 2009-140839 | 6/2009 |

* cited by examiner

*Primary Examiner* — Tulsidas C Patel
*Assistant Examiner* — Harshad Patel
(74) *Attorney, Agent, or Firm* — Greenblum & Bernstein, P.L.C.

(57) ABSTRACT

A printed circuit board terminal includes a rectangular metal wire rod having a substantially rectangle cross-section. One longitudinal end portion of the printed circuit board terminal includes an insertion portion that is configured to be inserted into a through hole provided in a printed circuit board and soldered. A conducting metal plated layer is provided on an entire surface of the rectangular metal wire rod. One marginal portion of the insertion portion, which faces a long side direction of the rectangle cross-section, is removed to reduce a dimension in the long side direction corresponding to a width direction.

12 Claims, 6 Drawing Sheets

PRINTED CIRCUIT BOARD TERMINAL AND PRINTED CIRCUIT BOARD CONNECTOR HAVING THE SAME

CROSS-REFERENCE TO RELATED APPLICATIONS

The present application claims priority under 35 U.S.C. §119 of Japanese Application No. 2009-258249, filed on Nov. 11, 2009, the disclosure of which is expressly incorporated by reference herein in its entirety.

BACKGROUND OF THE INVENTION

1. Field of the Invention

The present invention relates to a printed circuit board terminal, made of a metal wire rod, which is inserted into a through hole in a printed circuit board and is soldered to an electrically-conducting path, and to a connector having the printed circuit board terminal.

2. Description of Related Art

Conventionally, a printed circuit board having many relays, fuses, and the like, to distribute electric power to various electric components, is used as an electric junction box mounted on a vehicle. In such a printed circuit board, a printed circuit board terminal is used to electrically connect an electrically-conducting path on the printed circuit board to an external electrically-conducting path. Generally, a tip of the printed circuit board terminal is inserted into a through hole in the printed circuit board, and is soldered to the electrically-conducting path on the printed circuit board, and thus is fixed to the printed circuit board.

In recent years, a density increase in implementation and wiring of a printed circuit board is desired. In order to respond to such a density increase, it is considered to make the pitch of the printed circuit board terminals narrow. However, when the pitch of the printed circuit board terminals is narrowed, the interval between the through holes provided in the printed circuit board also becomes narrow, and formation of the through holes and soldering become difficult. Further, it is difficult to secure the strength of the printed circuit board between the through holes.

Accordingly, Japanese Patent Application Publication No. 2000-30834 discloses a printed circuit board terminal in which only a tip portion, which is inserted into a through hole, is processed to have a small width dimension, such as by cutting. According to such a printed circuit board terminal, while a sufficient width dimension of the member is secured at the connection side end portion, the diameter of the through hole provided in the printed circuit board can be reduced.

However, when a metal wire rod is used as the printed circuit board terminal, since both of the opposite side surfaces in the width direction of the terminal are processed, such as by cutting, to make the width of an insertion portion of the printed circuit board terminal narrow, a non-plated base material is exposed at both side surfaces of the terminal. Therefore, a solder wick may become poor. In particular, in recent years, lead-free soldering is more likely to be used, in consideration of impacts on the environment. In the lead-free soldering, the reduction in solder wettability occurs more prominently due to peeling of plate.

Japanese Patent Application Publication No. 2000-30834 discloses that, in order to improve solder wettability, the printed circuit board terminal made of metal wire rod is used, and after the terminal insertion portion is processed to reduce the width, such as by cutting, a conductive metal plated layer is provided on the surface. However, the after-plating process makes the manufacturing process of the printed circuit board terminal complicated, and increases the cost. Accordingly, another solution is desired.

SUMMARY OF THE INVENTION

In view of the above circumstances, the present invention provides a printed circuit board terminal having a new configuration, in which the printed circuit board terminal is made of a metal wire rod and is insertable into a small-diameter through hole, and sufficient solder wettability can be achieved without after-plating.

The present invention further provides a printed circuit board connector having such a printed circuit board terminal.

An aspect of the present invention related to a printed circuit board terminal provides a printed circuit board terminal made of a cut wire rod. The cut wire rod is made by cutting a rectangular metal wire rod having a rectangle cross-section to a predetermined length. One end portion of the printed circuit board terminal in an longitudinal direction includes an insertion portion that is inserted into a through hole provided in a printed circuit board and is soldered. A conducting metal plated layer is provided on an entire surface of the rectangular metal wire rod. One of marginal portions of the insertion portion, facing in a long side direction of the rectangle cross-section, is cut away to reduce a dimension in the long side direction. The long side direction corresponds to a width direction.

According to the aspect of the present invention, the dimension in the long side direction of the printed circuit board terminal is reduced at the insertion portion, which is inserted into the through hole. Accordingly, the size of the through hole provided in the printed circuit board can be reduced. As a result, while the other end portion, having a rectangle cross-section, on the side opposite to the insertion portion is connectable to another connector, an amount of necessary space on the printed circuit board can be reduced.

In addition, since the insertion portion is formed by cutting away only the marginal portion at one end in the width direction of the cut wire rod having the rectangle cross-section, the plated layer previously provided on the surface of the metal wire rod can remain on the three side surfaces of the insertion portion, other than the surface at the cut away side in the width direction. Accordingly, by taking advantage of the plated layer provided on the three surfaces, the printed circuit board terminal in which the solder wettability at the insertion portion is sufficiently secured, can be provided cost effectively. In particular, even in the lead-free solder, etc., that requires an improved solder wettability, a sufficient solder wick can be realized without performing after-plating.

An aspect of the present invention relating to a printed circuit board connector provides a printed circuit board connector that includes a connector housing, and a plurality of printed circuit board terminals attached to the connector housing to penetrate the connector housing. One end portion of each printed circuit board terminal includes an insertion portion that is inserted into a through hole provided in a printed circuit board and is soldered. Another end portion of each printed circuit board terminal extends toward an inside of the connector housing and is connectable to an external terminal. At least one of the plurality of printed circuit board terminals is the printed circuit board terminal according to the above-described aspect of the present invention.

In the printed circuit board terminal according to this aspect of the present invention, since the printed circuit board terminal according to the aspect of the present invention is used for any terminal of the plurality of printed circuit board terminals attached to the connector housing, the size of the through hole can be reduced at a necessary portion in accordance with the requirement of circuit wiring, and thus a space on the printed circuit board can be secured. In addition, by utilizing the printed circuit board terminal according to the aspect of the present invention to conform the size of the insertion portion to that of the other printed circuit board terminal, the through holes can be universal.

In a further aspect of the present invention relating to a printed circuit board connector, in the above-described printed circuit board connector, the plurality of printed circuit board terminals may include a plurality of kinds of terminals having different width dimensions in an aligning direction of the plurality of printed circuit board terminals. One of the plurality of kinds of terminals having a longer width dimension includes the printed circuit board terminal according to the above-described aspect of the present invention.

According to this aspect of the present invention, when the printed circuit board connector includes terminals having various width dimensions (shapes of cross-section), by utilizing the printed circuit board terminal according to the aspect of the present invention as a printed circuit board terminal having a rectangle cross-section with a long width dimension, the width dimension of the insertion portion can be reduced. Accordingly, even if the printed circuit board connector includes both a terminal having a rectangle cross-section and a terminal having a square cross-section, the insertion portions can be uniform in size. Therefore, the through holes provided in the printed circuit board can have a universal shape, regardless of the width dimension of the terminals. Thus, formation of an elongate through hole is not required and thus the cost can be reduced.

Another aspect of the present invention provides a printed circuit board terminal including a rectangular metal wire rod having a substantially rectangle cross-section, one longitudinal end portion of the printed circuit board terminal including an insertion portion that is configured to be inserted into a through hole provided in a printed circuit board and soldered. A conducting metal plated layer is provided on an entire surface of the rectangular metal wire rod, and one marginal portion of the insertion portion, which faces a long side direction of the rectangle cross-section, is removed to reduce a dimension in the long side direction corresponding to a width direction.

The rectangular metal wire rod may be cut to a predetermined length, and the one marginal portion of the insertion portion may be removed by cutting. The one marginal portion of the insertion portion may be cut to have tapered surfaces at both ends of a flat surface. The one marginal portion of the insertion portion may be cut to have curved surfaces at both ends of a flat surface. The one marginal portion of the insertion portion may be cut to have a slanted surface. The insertion portion may have a substantially square cross-section.

Another aspect of the present invention provides a printed circuit board connector including a connector housing, and a plurality of printed circuit board terminals attached to and penetrating the connector housing. One end portion of each printed circuit board terminal includes an insertion portion that is configured to be inserted into a through hole provided in a printed circuit board and soldered. Another end portion of each printed circuit board terminal extends toward an inside of the connector housing and configured to be connected to an external terminal. At least one of the plurality of printed circuit board terminals is the printed circuit board terminal according to the above-described aspect of the present invention.

Another aspect of the present invention provides a printed circuit board connector including a connector housing, and a plurality of printed circuit board terminals attached to and penetrating the connector housing. One end portion of each printed circuit board terminal includes an insertion portion that is configured to be inserted into a through hole provided in a printed circuit board and soldered. Another end portion of each printed circuit board terminal extends toward an inside of the connector housing and configured to be connected to an external terminal. The plurality of printed circuit board terminals includes a plurality of kinds of terminals having different width dimensions in an aligning direction of the plurality of printed circuit board terminals. One of the plurality of kinds of terminals having a longer width dimension includes the printed circuit board terminal according to the above-described aspect of the present invention.

According to the aspects of the present invention, an insertion portion to be inserted into a through hole is made by cutting away only the marginal portion at one side in a width direction of a cut wire rod, which has a rectangle cross-section and an entire surface of which is covered by a plated layer. Accordingly, a dimension in the long side direction of the insertion portion of the printed circuit board terminal can be reduced, and thus the size of the through hole provided in the printed circuit board can be reduced. As a result, the space on the printed circuit board can be used efficiently. Further, since the plated layer remains on the three surfaces other than the surface cut away at the insertion portion, solder wettability is secured and an after-plating process is not required. Accordingly, a manufacturing cost efficiency can be improved.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Embodiments of the present invention will be described hereinafter with reference to the drawings.

Figure 1:
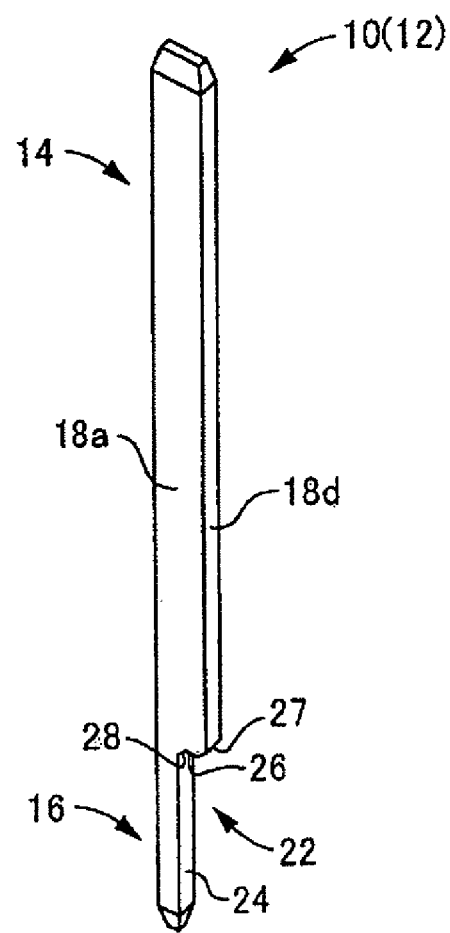
FIG. 1 is a perspective view of a printed circuit board terminal according to an embodiment of the present invention.
Figure 2:
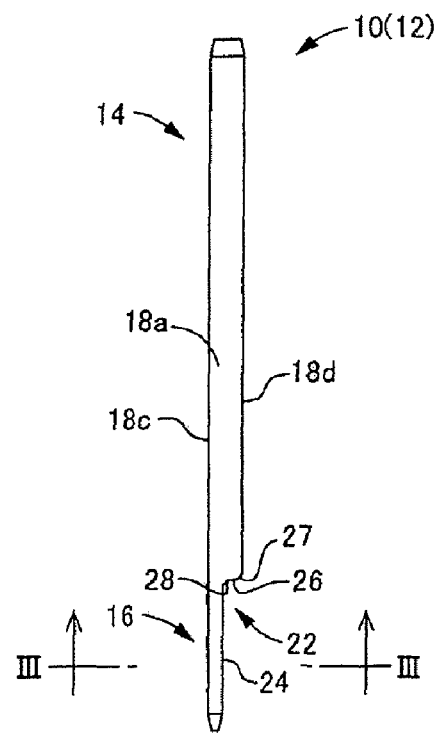
FIG. 2 is a front elevation view of the printed circuit board terminal shown in FIG. 1.
Figure 3:
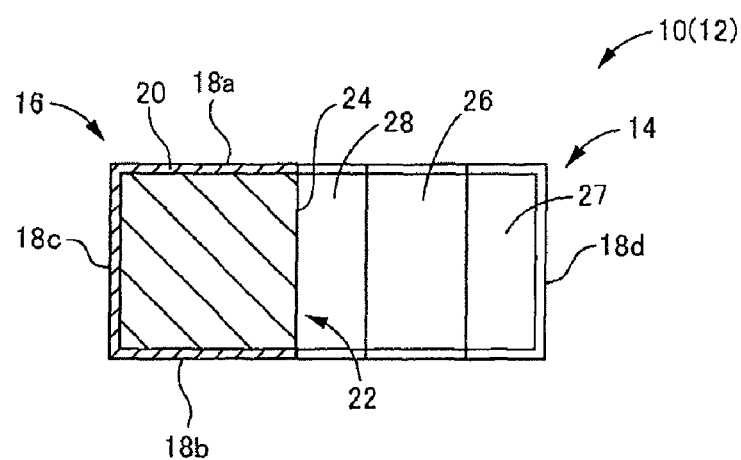
FIG. 3 is an explanatory cross-sectional view illustrating the cross-section taken along the line III-III of FIG. 2.

FIGS. 1-3 show a printed circuit board terminal 10 according to an embodiment of the present invention related to a printed circuit board terminal. The printed circuit board terminal 10 is made of a cut wire rod 12, which is made by cutting a rectangular metal wire rod having a rectangle cross-section to a predetermined length, or in any other suitable manner. A terminal connection portion 14 is provided at an end of the printed circuit board terminal 10 in a length direction thereof (vertical direction in FIG. 2), and an insertion portion 16 is provided at another end of the printed circuit board terminal 10. The terminal connection portion 14 extends in the length direction and has a generally constant rectangle cross-section, which corresponds to the cross-section of the cut wire rod 12. The insertion portion 16 extends in the length direction and has a generally constant square cross-section. Both end portions of the cut wire rod 12 in the length direction are tapered as necessary, such as by a squeezing process, or in any other suitable manner.

The rectangular metal wire rod forming the cut wire rod 12 includes a base material, which is a conducting metal wire made of any suitable material, such as copper or iron, having a rectangle cross-section. An entire surface of the four side surfaces of the base material is plated with a suitable conducting metal material, such as tin or gold. The cut wire rod 12, made by cutting the rectangular metal wire rod, has a rectangle cross-section of any suitable size, such as of size 1.5× 0.64 mm or of size 2.3×0.64 mm, for example, and a plated layer 20 (see FIG. 3) is provided on the entire surface of the four side surfaces 18a-18d of the terminal connection portion 14.

A cutout portion 22 is provided at an end of the cut wire rod 12 on the side opposite to the terminal connection portion 14 in the length direction, such as by cutting away a marginal portion on the side of the side surface 18d among the side surfaces 18c, 18d. The side surfaces 18c, 18d face each other in a width direction (horizontal direction in FIG. 2), which is a direction in which the long side of the rectangle cross-section extends. The cutout portion 22 may be formed by a suitable cutting process. The cutout portion 22 may preferably formed by punching out the marginal portion of the cut wire rod 12 on the side of the side surface 18d by press working.

The insertion portion 16 is a portion of the cut wire rod 12 at which the cutout portion 22 is provided to reduce the dimension in the long side direction of the rectangle cross-section. Thus, the insertion portion 16 is formed on one side (left side in FIG. 2) of the cut wire rod 12 in the width direction thereof. The insertion portion 16 has three side surfaces common to the side surfaces 18a, 18b, 18c of the terminal connection portion 14, and has a generally square cross-section. The plated layer 20 is provided over the substantially entire three side surfaces 18a, 18b, 18c. On the other hand, the side surface 24, which is created by forming the cutout portion 22, is a non-plated surface, on which the plated layer 20 is not provided, and at which the base material of the cut wire rod 12 is exposed to an exterior. The length dimension of the insertion portion 16 is preferably shorter than the length dimension of the terminal connection portion 14, to secure rigidity of the printed circuit board terminal 10 and connectivity of the terminal connection portion 14 with an external terminal.

Further, as shown in FIG. 3, which shows the printed circuit board terminal 10 of FIG. 2 viewed from below (bottom of FIG. 2), an extending surface 26 is provided at the connecting portion between the insertion portion 16 and the terminal connection portion 14, by forming the cutout portion 22. The extending surface 26 extends from the side surface 24 of the insertion portion 16 in a direction perpendicular to the length direction of the insertion portion 16. In particular, in this embodiment, a first tapered surface 27 is provided at an end of the extending surface 26 on the side of the side surface 18d. The first tapered surface 27 expands the cutout portion 22 toward the side surface 18d. Thus, since an open end marginal portion of the cutout portion 22 is rounded off, handling safety is improved. Further, when the terminal connection portion 14 of the printed circuit board terminal 10 is inserted into a through hole provided in a base of a printed circuit board connector or into a mold piece used in an insert molding of a printed circuit board connector, an end portion of the terminal connection portion 14 on the side of the insertion portion 16 can be easily inserted by using the first tapered surface 27 as a guiding surface. Moreover, a second tapered portion 28 is provided at a proximal portion of the extending surface 26 on the side of the side surface 24, such that the width dimension of the insertion portion 16 gradually increases toward the terminal connection portion 14. Thus, the strength of the connecting portion between the insertion portion 16 and the terminal connection portion 14 is secured. Accordingly, during insertion of the printed circuit board terminal 10 into a through hole 32, soldering, punching processing of the cutout portion 22, and other steps, occurrence of damage, such as a crack, or deformation, which is caused by concentration of stress to the connecting portion between the insertion portion 16 and the terminal connection portion 14, can be reduced.

Figure 4:
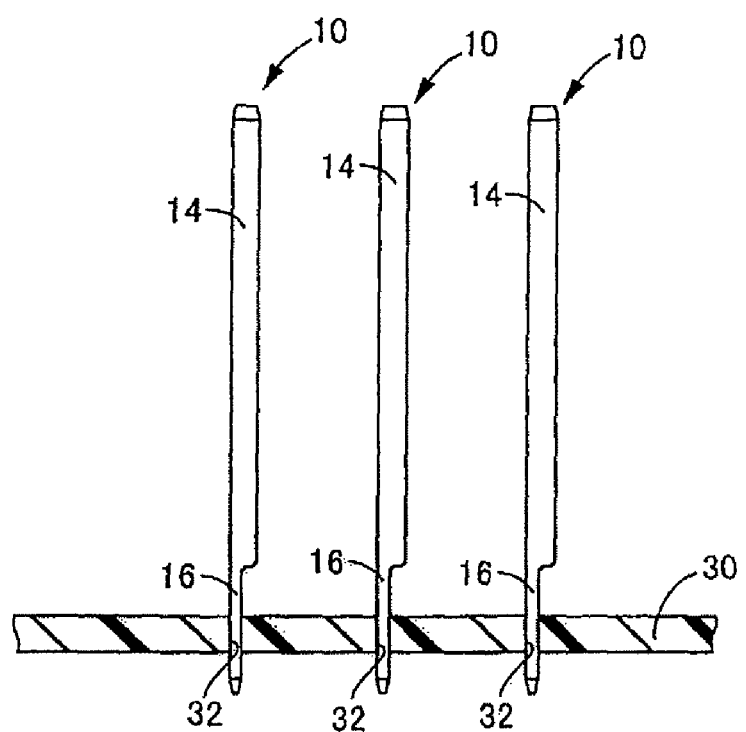
FIG. 4 is an explanatory partial cross-sectional view illustrating a state when the printed circuit board terminal shown in FIG. 1 is attached to a printed circuit board.

According to the printed circuit board terminal 10 thus configured, as shown in FIG. 4, for example, the insertion portion 16 is inserted into a through hole 32 provided in a printed circuit board 30 and is soldered. Thus, the printed circuit board terminal 10 is electrically connected with a printed circuit (not shown) provided on the printed circuit board 30. The terminal connection portion 14 extends from the printed circuit board 30, and is connectable to another connector, or other suitable structure, which corresponds to a not-shown external terminal.

According to the printed circuit board terminal 10 configured as in this embodiment, since the insertion portion 16 has a substantially square cross-section, the insertion portion 16 can be inserted into a circular through hole 32. Thus, the through hole 32 does not need to be an elongate hole. Therefore, the through hole 32 can be downsized. Further, the terminal connection portion 14, having the rectangle cross-section, is connectable to another connector, or other suitable structure, and a space efficiency of the printed circuit board can be improved. Further, the through hole 32 can be formed easily and in a cost-effective way. Moreover, when plural terminals 10 are arranged along the width direction, as shown in FIG. 4, since the distance between two insertion portions 16 can be increased, short-circuit can be prevented.

Further, since the insertion portion 16 is formed by cutting away only a marginal portion at one end of the cut wire rod 12 in the width direction, the plated layer 20 provided on a surface of the rectangular metal wire rod forming the cut wire rod 12 remains on the three side surfaces 18*a*, 18*b*, 18*c* of the insertion portion 16. Accordingly, even in the lead-free solder that requires higher solder wettability, the solder wettability of the insertion portion 16 can be secured without performing after-plating. Therefore, it is possible to improve manufacturing cost efficiency.

Additionally, since the dimension in the direction of the long side of the rectangle cross-section is reduced at the insertion portion 16 by cutting away only one side of the cut wire rod 12 in the width direction thereof, a greater cutting width in the width direction of the cut wire rod 12 can be secured in a press punching process, or other suitable process, compared with when both sides of the cut wire rod 12 in the width direction are cut away. Accordingly, the insertion portion 16 can be formed more easily and with a higher precision.

Figure 5:
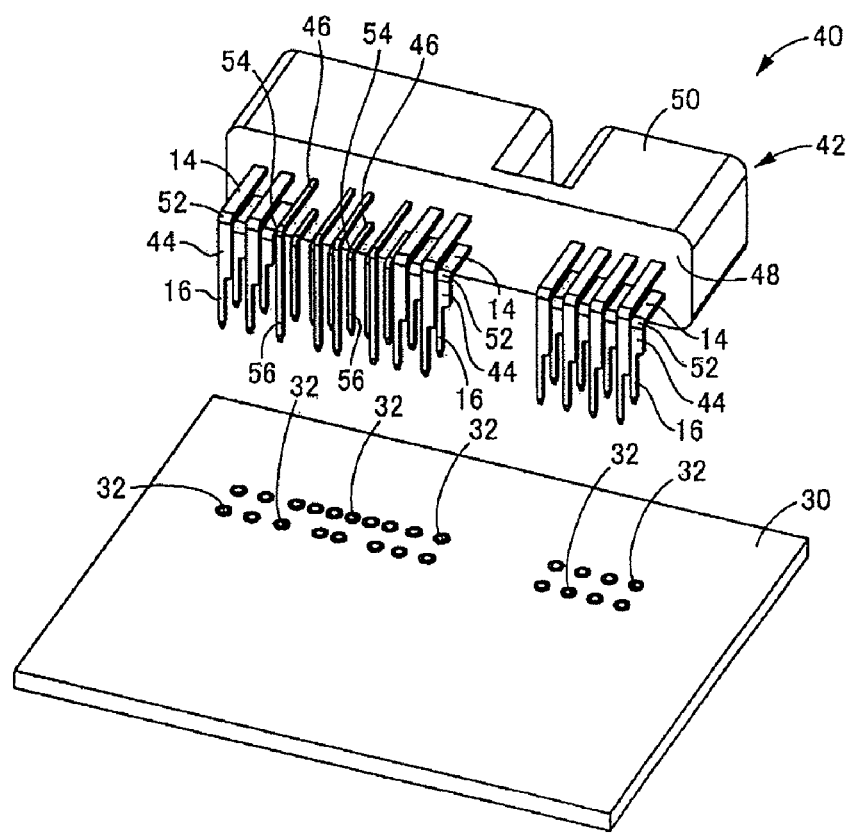
FIG. 5 is an exploded perspective view illustrating a printed circuit board connector and a printed circuit board according to an embodiment of the present invention.

The printed circuit board terminal 10 according to the embodiment of the present invention may be used such that a single printed circuit board terminal 10 extends from the printed circuit board 30, as shown in FIG. 4. Alternatively, the printed circuit board terminal 10 may be used as a terminal of a printed circuit board connector, for example. FIG. 5 shows a printed circuit board connector 40 according to an embodiment of the present invention with regard to a printed circuit board connector.

The printed circuit board connector 40 has a connector housing 42 and plural printed circuit board terminals 44, 46 attached to the connector housing 42 so as to penetrate it. The connector housing 42 is made of any suitable material, such as a nonconductive synthetic resin, and has a generally box shape in which a bottom portion 48 and peripheral wall 50, which extends from the bottom portion 48, are integrally formed, having an opening to one side.

The printed circuit board terminal 44 has a configuration substantially similar to the printed circuit board terminal 10 according to the above-described embodiment of the present invention. Therefore, components of the printed circuit board terminal 44 are denoted by the reference numerals same as those of the printed circuit board terminal 10, and detailed explanation thereof will be omitted. The printed circuit board terminal 44 has a bent portion 52 in the middle of the terminal connection portion 14 of the printed circuit board terminal 10, at which the printed circuit board terminal 10 is bent substantially perpendicularly. Thus, the printed circuit board terminal 44 has an L-shape as a whole. On the other hand, the printed circuit board terminal 46 is a linear terminal having a substantially square cross-section, which is substantially the same size as that of the insertion portion 16 of the printed circuit board terminal 44. The printed circuit board terminal 46 also has a bent portion 54 in the middle in the length direction thereof. Thus, the printed circuit board terminal 46 also has an L-shape as a whole.

A plurality of these printed circuit board terminals 44, 46 are attached to the connector housing 42 so as to penetrate the bottom portion 48. Thus, the terminal connection portion 14 of the printed circuit board terminal 44, and one end portion (not shown) of the printed circuit board terminal 46 extend toward the inside of the connector housing 42 surrounded by the peripheral wall 50. Further, the bent portion 52 and the insertion portion 16 of the printed circuit board terminal 44 and the bent portion 54 and the other end portion 56 of the printed circuit board terminal 46 extend outwardly from the connector housing 42. The insertion portion 16 and the end portion 56 respectively extend toward the printed circuit board 30. The printed circuit board terminals 44, 46 may be fixed to the connector housing 42, by pressing the printed circuit board terminals 44, 46 into through holes provided in the bottom portion 48 of the connector housing 42, or by insert molding with the connector housing 42.

Thus, the plural printed circuit board terminals 44, 46 are attached to the connector housing 42 so as to be aligned. In this embodiment, the printed circuit board terminals 44, 46 are arranged in two rows. The printed circuit board terminals 44 are arranged such that the long side of the rectangle cross-section of the terminal connection portion 14 extends along the direction of the alignment. By doing so, the printed circuit board terminal 44 having a rectangle cross-section and the printed circuit board terminal 46 having a square cross-section are mutually different in the width dimension in the alignment direction. The printed circuit board terminal 44 has a greater width dimension in the alignment direction, compared with the printed circuit board terminal 46. Further, the plural printed circuit board terminals 44 are arranged such that the insertion portions 16 of the terminals are positioned on the same side in the alignment direction.

The printed circuit board connector 40 thus configured is attached to the printed circuit board 30 by inserting the insertion portion 16 of the printed circuit board terminal 44 and the end portion 56 of the printed circuit board terminal 46 extending outward from 42 into the through holes 32 in the printed circuit board 30, and by soldering them. The terminal connection portion 14 of the printed circuit board terminal 44 and the end portion (not shown) of the printed circuit board terminal 46, both extending toward the inside of the connector housing 42, are connectable to the other connector, or other suitable structure, as a not-shown external terminal.

In the printed circuit board connector 40 according to this embodiment, a printed circuit board terminal 44 according to the embodiment of the present invention may be used as any one of plural terminals attached to the connector housing 42. By doing so, while the terminal connection portion 14 having a rectangle cross-section can be connected to the other connector, the through hole 32 can be downsized by the insertion portion 16, and thus a greater available space can be secured on the printed circuit board 30. Further, since the insertion portion 16 and the printed circuit board terminal 46 have substantially the same square cross-section, each of the printed circuit board terminal 44 and the printed circuit board terminal 46 can be inserted into similar circular through holes 32. Accordingly, elongate through holes do not need to be provided, and the through holes can have a common shape and/or size. Thus, more excellent production efficiency can be achieved.

Additionally, since the width dimension of the printed circuit board terminal 44 is reduced at the insertion portion 16, thereby reducing the rigidity thereof, an occurrence of a solder crack can be reduced when the printed circuit board connector 40 is soldered to the printed circuit board 30. Further, since the width dimension is reduced at the insertion portion 16, visibility of the insertion portions of the plural printed circuit board terminals 44, 46 into the through holes 32 can be improved, and ease in observing solder wicking, etc., can be improved.

While details of the embodiments of the present invention are described above, the present invention is not limited to the concrete description thereof. For example, the shape of the cross-section of the insertion portion 16 is not limited to the substantially square shape. A rectangle cross-section in which the width dimension of the side surfaces 18*a*, 18*b* (horizontal direction in FIG. 3) is greater than the width dimension of the side surface 18*c*, 24 (vertical direction in FIG. 3), or a rectangle cross-section in which the width dimension of the side surfaces 18a, 18b is smaller than the width dimension of the side surfaces 18c, 24, may be employed, in view of a required rigidity of the printed circuit board terminal 10, the space on the printed circuit board, or other similar requirements.

Figure 6:
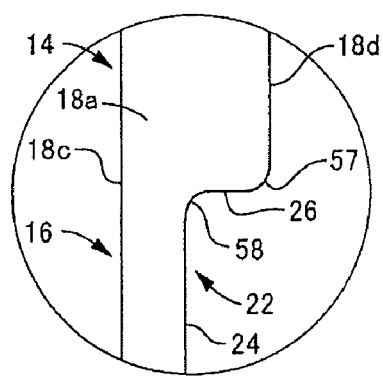
FIG. 6 is an explanatory enlarged view illustrating a main portion of a printed circuit board terminal according to another embodiment of the present invention.
Figure 7:
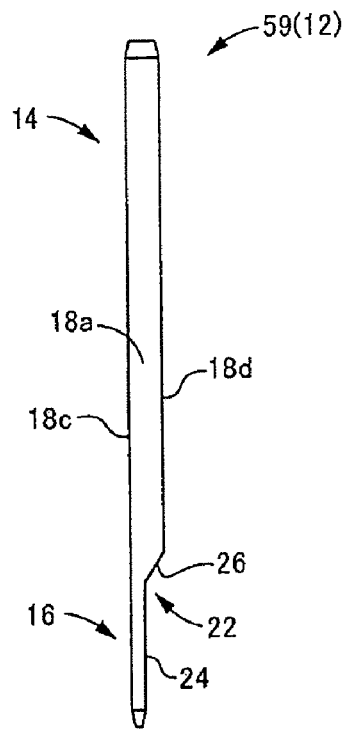
FIG. 7 is a front elevation view of a printed circuit board terminal according to a yet another embodiment of the present invention.

Further, as shown in FIG. 6, illustrating an enlarged main portion, a first curved surface 57 and a second curved surface 58 may be respectively provided at the portions where the first tapered surface 27 and the second tapered surface 28 are provided in the above-described embodiments. By doing so, a smoother guiding effect and a further stress relaxation can be achieved. Meanwhile, the first tapered surface, 27, the second tapered surface 28, the first curved surface 57 and the second curved surface 58 are not necessarily required. For example, in the above-described embodiment, the entire extending surface 26 may be a flat surface extending in a direction perpendicular to the length direction of the cut wire rod 12, without providing the first tapered surface 27 and the second tapered surface 28, such that a right-angled corner is formed at the connecting portion between the extending surface 26 and the side surface 18d and at the connecting portion between the extending surface 26 and the side surface 24. Moreover, as is the printed circuit board terminal 59 shown in FIG. 7, which is another embodiment of the present invention regarding the printed circuit board terminal, the entire extending surface 26 may be a surface which is inclined with respect to the direction perpendicular to the length direction of the cut wire rod 12 in, such that the dimension of the cut wire rod 12 in the long side direction of the rectangle cross-section thereof (dimension in the horizontal direction in FIG. 7) is gradually reduced from the terminal connection portion 14 to the insertion portion 16.

Figure 8:
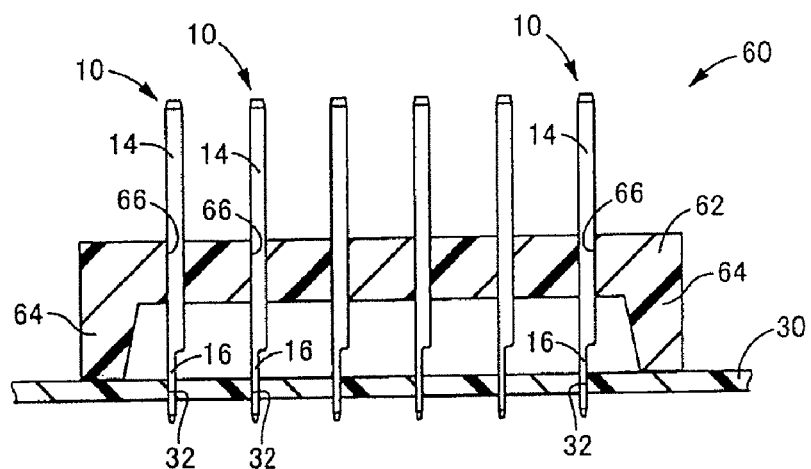
FIG. 8 is an explanatory partial cross-sectional view illustrating a different utilization of the printed circuit board terminal according to the embodiments of the present invention.

Further, as shown in FIG. 8, the printed circuit board terminal according to the embodiment of the present invention may be used as a printed circuit board terminal for a pedestal-shaped printed circuit board connector 60. The printed circuit board connector 60 shown in FIG. 8 has a connector pedestal 62 placed on the printed circuit board 30. The connector pedestal 62 has a generally block-shape made of any suitable material, such as a non-conductive synthetic resin. Leg portions 64, extending toward the printed circuit board 30, are provided at the four corner portions of the connector pedestal 62. The terminal connection portions 14 of plural printed circuit board terminals 10 of the above-described embodiment are respectively inserted, in a press-fit condition, into terminal insertion holes 66, which penetrate the connector pedestal 62. Thus, the printed circuit board connector 60 is formed by attaching the plural printed circuit board terminals 10 to the connector pedestal 62 so as to penetrate it. The plural printed circuit board terminals 10 may be insert-molded with the connector pedestal 62.

Then, the connector pedestal 62 is mounted on the printed circuit board 30, and the plural insertion portions 16 of the printed circuit board terminals 10, extending from the connector pedestal 62, are respectively inserted into the through holes 32 and soldered. By using the printed circuit board terminal 10 according to the embodiment of the present invention, for the printed circuit board connector 60, similar to the printed circuit board connector 40, the rigidity is reduced at the insertion portion 16, and thus occurrence of solder crack can be reduced. Further, since the width dimension is reduced at the insertion portion 16, the available space on the printed circuit board 30 can be secured, short-circuit is prevented, and the visibility of the space between the connector pedestal 62 and the printed circuit board 30 is improved, and thus ease in observing solder wicking, etc., can be improved.

Figure 9:
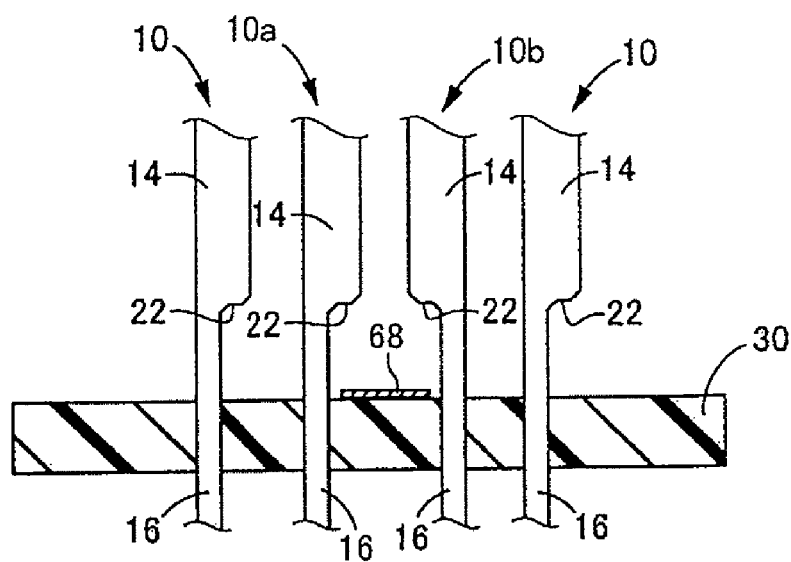
FIG. 9 is an explanatory partial cross-sectional view illustrating another state when the printed circuit board terminal shown in FIG. 1 is attached to a printed circuit board.

When plural printed circuit board terminals 10 are aligned in the width direction, as in the case used in the printed circuit board connector, as shown in FIG. 9, schematically illustrating the main portion, the orientation of some of the plural printed circuit board terminals 10 may be different from that of the others (the orientation of the printed circuit board terminal 10b is different from the others in FIG. 9), such that the cutout portions 22 of an adjacent pair of printed circuit board terminals 10a, 10b, are positioned at opposite sides in the aligning direction. By doing so, a greater distance between the insertion portions 16 of the printed circuit board terminals 10a, 10b can be secured. Accordingly, a printed wiring 68 having a greater width dimension may be placed between the printed circuit board terminals 10a and 10b.

Further, an insertion amount of the printed circuit board terminal into the printed circuit board may be defined by bringing an end surface of the terminal connection portion extending from the insertion portion (extending surface 26 in the above-described embodiment) in contact with the printed circuit board. By doing so, the plural printed circuit board terminals can easily be uniform in the amount of extension from the printed circuit board. In this case, the width dimension of the printed circuit board terminal is preferably set to the size that does not exceed the land of a through hole, so that the effect of improving space efficiency of the printed circuit board or the effect of preventing short-circuit is not impaired.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A printed circuit board terminal comprising a rectangular metal wire rod having a substantially rectangular cross-section perpendicular to a longitudinal direction of the printed circuit board terminal, one longitudinal end portion of the printed circuit board terminal comprising an insertion portion that is configured to be inserted into a through hole provided in a printed circuit board and soldered,
   wherein a conducting metal plated layer is provided on an entire surface of the rectangular metal wire rod, and
   only one marginal portion of the insertion portion, which faces a long side direction of the rectangular cross-section, is removed to reduce a dimension in the long side direction corresponding to a width direction, such that one surface of four surfaces of the insertion portion, corresponding to the removed marginal portion is unplated, and other three of the four surfaces are plated.

2. The printed circuit board terminal according to claim 1, wherein the rectangular metal wire rod is cut to a predetermined length, and the one marginal portion of the insertion portion is removed by cutting.

3. The printed circuit board terminal according to claim 2, wherein the one marginal portion of the insertion portion is cut to have tapered surfaces at both ends of a flat surface.

4. The printed circuit board terminal according to claim 2, wherein the one marginal portion of the insertion portion is cut to have curved surfaces at both ends of a flat surface.

5. The printed circuit board terminal according to claim 2, wherein the one marginal portion of the insertion portion is cut to have a slanted surface.

6. The printed circuit board terminal according to claim 1, wherein the insertion portion has a substantially square cross-section.

7. A printed circuit board connector comprising:
a connector housing; and
a plurality of printed circuit board terminals attached to and penetrating the connector housing, one end portion of each printed circuit board terminal comprising an insertion portion that is configured to be inserted into a through hole provided in a printed circuit board and soldered, another end portion of each printed circuit board terminal extending toward an inside of the connector housing and configured to be connected to an external terminal,
wherein at least one of the plurality of printed circuit board terminals is the printed circuit board terminal according to claim 1.

8. The printed circuit board connector according to claim 7, wherein in the at least one of the plurality of printed circuit board terminals the rectangular metal wire rod is cut to a predetermined length, and the one marginal portion of the insertion portion is removed by cutting.

9. The printed circuit board connector according to claim 7, wherein in the at least one of the plurality of printed circuit board terminals the insertion portion has a substantially square cross-section.

10. A printed circuit board connector comprising:
a connector housing; and
a plurality of printed circuit board terminals attached to and penetrating the connector housing, one end portion of each printed circuit board terminal comprising an insertion portion that is configured to be inserted into a through hole provided in a printed circuit board and soldered, another end portion of each printed circuit board terminal extending toward an inside of the connector housing and configured to be connected to an external terminal,
wherein the plurality of printed circuit board terminals comprise a plurality of kinds of terminals having different width dimensions in an aligning direction of the plurality of printed circuit board terminals, and
one of the plurality of kinds of terminals having a longer width dimension comprises the printed circuit board terminal according to claim 1.

11. The printed circuit board connector according to claim 10, wherein in the one of the plurality of kinds of terminals the rectangular metal wire rod is cut to a predetermined length, and the one marginal portion of the insertion portion is removed by cutting.

12. The printed circuit board connector according to claim 10, wherein in the one of the plurality of kinds of terminals the insertion portion has a substantially square cross-section.

* * * * *